United States Patent [19]

Shimazu et al.

[11] 4,391,894
[45] Jul. 5, 1983

[54] COLORED PHOTOSENSITIVE COMPOSITION

[75] Inventors: Ken-ichi Shimazu, Pleasantville; Albert Deutsch, Scarsdale, both of N.Y.

[73] Assignee: Polychrome Corporation, Yonkers, N.Y.

[21] Appl. No.: 298,054

[22] Filed: Aug. 28, 1981

Related U.S. Application Data

[63] Continuation of Ser. No. 919,098, Jun. 20, 1978, abandoned, which is a continuation-in-part of Ser. No. 521,433, Nov. 6, 1974, abandoned.

[51] Int. Cl.$^3$ ............. G03C 1/60; G03C 11/18; G03F 1/00; G03C 1/71
[52] U.S. Cl. ............. 430/154; 430/168; 430/169; 430/175; 430/176; 430/177; 430/292; 430/293; 430/294; 430/145; 430/194; 430/196; 430/197; 430/270; 430/143
[58] Field of Search ............. 430/168, 169, 175, 294, 430/292, 293, 145, 176, 177, 154, 270, 143

[56] References Cited

U.S. PATENT DOCUMENTS

| | | | |
|---|---|---|---|
| 2,716,060 | 8/1955 | Lupo | 96/93 |
| 3,010,391 | 11/1961 | Buskes | 96/75 |
| 3,407,065 | 10/1968 | Chalkley | 96/33 |
| 3,573,918 | 4/1971 | Chambers et al. | 96/28 |
| 3,598,586 | 8/1971 | Gaspar | 96/91 N |
| 3,681,074 | 8/1972 | Poot | 96/75 |
| 3,721,557 | 3/1973 | Inoue | 96/28 |
| 3,756,818 | 9/1973 | Hayakawa et al. | 96/35.1 |
| 3,854,946 | 12/1974 | Sayigh et al. | 96/35.1 |
| 3,890,152 | 6/1965 | Ruckert et al. | 96/91 R |

OTHER PUBLICATIONS

"Pocket Pal-A Graphic Arts Production Handbook," International Paper Co., 11th Ed., 1978, pp. 112–113.
Kosar, J., "Light-Sensitive Systems," J. Wiley & Sons, 1965, pp. 47–48 and pp. 137–143.
Color Index, 3rd Ed., The Society of Dyers & Colorists, 1971, vol. 1, pp. 1001–1002, 1607–1609, vol. 4, pp. 4419–4423.

Primary Examiner—Charles L. Bowers, Jr.

[57] ABSTRACT

A method for preparing a substantially uniformily dyed photosensitive composition useful in the reprographic arts, and compositions useful therefor. A water soluble basic dye is reacted with an organic acid, or an ammonium or alkali metal salt thereof which is preferably monofunctional and the reaction product is substantially uniformly dissolved in a photosensitive diazo composition to impart the desired dye color thereto. The resultant dye colored photosensitive composition may then be coated upon a suitable support, for example, a film or metal sheet, to provide a photosensitized product useful in the reprographic arts, which possesses substantially uniform color characteristics and extended shelf life.

9 Claims, No Drawings

COLORED PHOTOSENSITIVE COMPOSITION

CROSS REFERENCE TO RELATED APPLICATION

This application is a continuation of Ser. No. 919,098 filed June 20, 1978, now abandoned, which in turn was a continuation-in-part of co-pending patent application, Ser. No. 521,433 filed Nov. 6, 1974 now abandoned.

This invention relates to novel articles useful in the reprographic arts, which comprises a support means, substantially uniformly coated on one side thereof with a dye colored photosensitive composition, and to novel methods for the production thereof. More particularly, this invention relates to novel products useful in the reprographic arts, which comprise a substrate, for example, a support means, such as a film, paper or metal sheet, to at least one surface of which is substantially uniformly applied a color dyed photosensitive composition, said photosensitive composition possessing substantially uniform color characteristics and an extended shelf life, and to novel compositions and methods useful in the production thereof. The final products of this invention are employed in the reprographic arts, by having the photosensitized surface of the product exposed to a light source and then developed in order to form the desired pre-colored images.

In the past, it has been considered very desirable to prepare for use in the reprographic arts, photosensitive compositions which are color dyed. Such color dyed photosensitive compositions are useful in the reprographic arts in such processes as color proofing, or in conjunction with offset printing plates for better visualization. It has always been difficult to produce a suitable, substantially uniformly color dyed photosensitive composition, which can then be applied to the desired substrate for employment for such reprographic processes. Especially difficult has been the production of substantially uniformly color dyed photosensitive compositions which employ basic dyes to impart the desired color to the composition. Basic dyes are desirable in such compositions because they are the most brilliant dyes known. However in the past their use in admixture with diazo compositions in order to form a coating solution in a solvent has had several disadvantages. Basic dyes tend to precipitate in the coating solution thereby rendering the intensity of the color in the coating inconsistent and non-uniform. Another disadvantage has been that the shelf life of the product is very limited.

In the past, it has also been proposed that oil soluble dyes be admixed with such photsensitive compositions as the reaction product of, for example, paradiazodiphenylamine and formaldehyde, which is subsequently reacted with a coupling agent, for example, 2-hydroxy-4-methoxy benzophenone-5-sulfonic acid (known generically as "MS-40"). However this proposed method also has several disadvantages among which are that oil soluble dyes, as a class, are dull rather than brilliant in intensity, and also the resultant composition has poor stability, resulting in a reduced shelf life, which is commercially unacceptable.

These disadvantages also exist when the condensation product of paradiazo diphenylamine and formaldehyde reacted with a coupling agent, such as MS-40, is admixed with an acid dye. The acid dye tends to precipitate in the coating which when coated on a substrate, results in a product that also has a poor shelf life.

It has now been found that the problems heretofore existant in the preparation of color dyed photosensitive compositions can be solved by the practice of the instant invention. By the practice of this invention, it has been found possible to impart a substantially uniform color dye to a photosensitive composition which may then be applied to or coated on a desired substrate, the resultant photosensitive-coated product being useful in the reprographic arts, for example, in color proofing processes, and better visualization of exposed and developed lithographic plates. The final products of this invention possess extremely desirable color characteristics in addition to a commercially acceptable shelf life.

Generally, this invention relates to a process for the provision of a substantially uniformly color dyed photosensitive composition.

The novel photosensitive compositions of this invention are prepared in accordance with the process of this invention which entails a number of steps, beginning with a basic dye substance as starting material. Generally, the desired basic dye substance is reacted with an organic preferably monobasic acid, or the ammonium or alkali metal salt thereof, in an aqueous medium to yield a reaction product which is the dye material of this invention. This resultant dye material which is substantially soluble in organic solvents is then dissolved into the desirable photosensitive diazo composition to impart a substantially uniform color thereto, and the resultant color dye photosensitive composition may then be applied to the desired substrate to provide a final color-dyed photosensitive coated product which may be employed in any manner known to or desired by the skilled worker in the reprographic art.

More particularly, the process of this invention requires that an aqueous solution of a basic dye be reacted with an aqueous solution of an organic acid, or the ammonium or alkali metal salt thereof, yielding a precipitant reaction product. Surprisingly, this precipitant reaction product, is substantially insoluble in water, but substantially soluble in organic solvent and is a non-pigment, non lake material, which possesses very attractive properties. The precipitant dye materials not only retains the essential brilliance of the basic dye starting material, but also appears to be highly stable and possess and extended shelf life. The precipitant dye material thus obtained may then be substantially uniformly incorporated in a photosensitive composition, known to the skilled worker to be useful in the reprographic arts, to impart the desired color thereto. The resultant color dyed photosensitive composition may then be applied to the desired substrate for ultimate employment in the reprographic arts.

The conditions under which the process of this invention may be conducted have not been found to be critical, provided that complete reaction of the basic dye, and the organic acid, or salts thereof is obtained. Thus, the reaction may take place under normal pressure and room temperature. To insure complete reaction of the reactants it is recommended that vigorous admixture thereof be performed, for example, by shaking or stirring, although this is not essential for the satisfactory practice of the invention. In addition, the basic dye may be prepared as one basic solution, or the organic acid or its ammonium or alkali metal salt may be prepared as another aqueous solution and the former may be added to the latter or vice versa or the two may be brought together as confluent streams.

The resultant reaction product forms as a precipitate and may be isolated in any manner known to and acceptable to the skilled worker, for example, by filtration. The thus isolated reaction product, which is the essential dye material may then be incorporated in the selected photosensitive composition, for further employment in accordance with this invention.

The basic dye starting materials which may be employed in the practice of this invention are those which are water soluble and include those which are capable of importing such colors as yellow, orange, red, violet, blue, green, brown or black, to a substrate. More particularly, included among the basic dye starting materials which may be employed hereunder are such basic dyes as those listed in Volume 1 of the Colour Index (1956 Edition) pages 1619–1653, and include inter alia such basic dyes as Basic Yellow 1 through 13, (commercially available under such tradenames as Throflavine TG, Auramine SP, Phosphine GN from Allied Chemical Co.; Auramine G, Auracine G, Coriphosphine BG, Euchrysine jRRX from BASF; Astrazon Yellow from Farbenfabriken Bayer A. G.; and Sevron Yellow L from E. I. duPont de Nemours & Co.); Basic Orange 1 through 23 (available commercially under such tradenames as Chrysoidine, Dramond Phosphine, Flavo Phosphine, Euchrysine Orange, Rheonine from BASF; Astrazon Orange from Farbenfabriken Bayer A. G.) Basic Red 1 through 14, (available commercially under such tradenames as Rhodamine, Safrasine, Fuchsine from Ciba-Geigy); Basic Violet 1 through 14 (commercially available under such tradenames as Paris Violet, New Fuchsine O, Crystal Violet, Rhodamine B, Methylene Hetrotrope N from Compagnie Francaise des Matieres Colorantes; Colcozine Violet from American Cyanamid Co.); Basic Blue 1 through 26 (commercially available under such tradenames as Basic Blue G, Basic Navy Blue, Brilliant Basic Blue, Victoria Pure Blue, Methylene Blue JFA, Victoria Blue, Nile Blue, Paper Blue from General Dyestuff Co.); Basic Green 1 through 5 (commercially available under such tradenames as Calcozine Green from American Cyanamid Co.); Basic Brown 1 through 8 (commercially available under such tradenames as Bismark Brown from American Cyanamid Co.); and Basic Black 1 through 5 (commercially available under such tradenames as Calcozine Grey from American Cyanamid Co.). In the practice of this invention, the most satisfactory results are obtained with the use of such basic dye starting materials as are commonly employed in the reprographic arts, and include such basic dyes as Basic Yellow, Basic Red, Basic Violet, Basic Blue, and Basic Black, although the other basic dyes also provide satisfactory results.

The organic acids which may be employed in the practice of this invention are generally those which contain one or more carboxylic acid groups, sulfonic acid groups, sulfinic acid groups, phosphoric acid groups and phosphinic acid groups and the like. The ammonium or alkali metal salts thereof may be used in place of the free organic acids to react with the basic dyes. Illustrative of the alkali metal salts employable herein are lithium, sodium and potassium.

More particularly, the organic acids which may be satisfactorily employed in the practice of the instant invention are those which are water soluble, and include such diverse organic acids as organic acid dyes such as those listed in Volume 1 of the Colour Index (1956) pages 1001–1404, and include such organic acid dyes as Acid Yellow, Acid Orange, Acid Red, Acid Violet, Acid Blue, Acid Green, Acid Brown and Acid Black; polymeric acids, such as polymeric acids containing carboxyl groups, for example, polyacrylic acid, polyacrylamides containing some carboxyl groups, and polymeric acids containing sulfonyl groups, for example, polystyrenesulfonic acid.

Other organic acids which may be employed herein include such organic acids as the carboxylic acids and their salts, for example, hydrocarbon carboxylic acids, such as aliphatic carboxylic acids, such as alkanoic carboxylic acids, aromatic carboxylic acids, for example benzoic acid, naphthoic acid; the sulfonic acids and their salts, for example p-toluene sulfonic acid, naphthalene sulfonic aid, or 3,3,5,5-tetrabromophenol sulfone phthalein, sodium salt; the sulfinic acids and their salts, for example, R-toluene sulfinic acid; the phosphoric acid and their salts, for example, benzene phosphoric acid; and the phosphonic acids and their salts, for example benzene phosphinic acid.

Preferably, in the practice of this invention satisfactory results are obtained when the organic acid employed herein is selected from the group consisting of such organic salts, or the ammonium or alkali metal salts thereof, as hydrocarbon carboxylic acids, the polymeric carboxylic acids and the organic acid dyes.

Most preferably, it has been found that most satisfactory results are obtained in the practice of this invention when the organic acid employed herein is selected from the group consisting of monobasic organic acids and the organic acid dyes, and especially those which are employable in the reprographic arts. Among the organic acid dyes which may most preferably be employed in the practice of this invention are included Acid Yellow, Acid Red, Acid Violet, Acid Blue and Acid Black, although the other organic acid dyes also provide satisfactory results. It is to be understood of course, that the choice of basic dye employed in this invention will control the choice of the organic acid dye employable in conjunction therewith, if an organic acid dye is to be one of the reactants. In other words, the organic acid dye will correspond to the basic dye with which it is to be reacted, i.e., Basic Yellow dye will be reacted with Acid Yellow, Basic Red dye with Acid Red, and so on.

The precipitant dye material obtained from the reaction of the basic dye and the organic acid, has surprisingly been found to be substantially water insoluble, while at the same time substantially soluble in organic solvents. Among the organic solvents in which said precipitant dye material is soluble may be included such solvents as alcohols, such as alkanols; oxygenated organic solvents, for example, ethylene glycol monomethyl ether; ketones, such as acetone, methyl ethyl ketone; and esters, such as methyl acetate or ethyl acetate. In addition, the skilled worker can easily determine the acceptable organic solvent employable herein, in relation to the specific properties of the dye material obtained. Due to this surprising solubility property, the resultant precipitant dye material, which essentially retains the brilliance of the original basic dye starting material, may be incorporated in various known photosensitive compositions which are prepared with solvents compatable with said precipitant dye material, to impart thereto the desired color of the dye material.

Among the photosensitive compositions which may be treated with said precipitant dye to impart the desired color thereto, are those which are well known to the skilled artisan to be employable in the reprographic arts. Examples of such photosensitive compositions which may be so employed may be included those which are sensitized with diazo compounds, as are taught and disclosed in the following patent application Ser. No. 501,537, filed Aug. 29, 1974, now abandoned, in the names of Simon Chu and Eugene Golda. In addition, diazo-photosensitized resins may also be treated with the precipitant dye material to impart the desired color thereto.

In place of, or in addition to the resins mentioned above, one may use other resinous film-forming components, either natural or synthetic, of low molecular weight or high molecular weight (provided that a solubility differential is still obtainable), and either monomeric or oligomeric. Examples of such components are those described in copending U.S. application Ser. Nos. 315,212 filed Dec. 14, 1972, now abandoned and 328,678 filed Feb. 1, 1973, now abandoned. Compositions containing diazo components and resinous monomers are described in copending U.S. application Ser. Nos. 315,537, filed Aug. 29, 1974, in the names of Simon Chu and Eugene Golda, and Ser. No. 328,550 filed Feb. 1, 1973, now abandoned in the names of W. Rowe, A. Taudien and A. Deutsch.

Examples of such photosensitive compositions which may be so employed include those which are sensitized with diazo compounds, as are taught and disclosed in the publication, *Light Sensitive Systems* by Jaromir Kosar, John Wiley & Sons, New York, 1965.

These specifically include light sensitive materials such as, the diazo substances which may include the reaction product of paradiazo diphenyl amine para-formaldehyde condensate and 2-hydroxy-4-methoxy benzophenone sulfonic acid. The following diazo compositions are water soluble and may be made organic solvent soluble by reacting them with organic coupling agents such as the aforementioned organic acids by a method well known in the art. Such coupling agents are disclosed in U.S. Pat. Nos. 3,300,309 and 3,591,575 which are specifically incorporated herein by reference including naphthol sulfonic acids, naphthol sulfonic acid salts, sulfoamthranilic acid, N-lower alkyl-5-sulfoanthranilic acids, sodium 2,2'-dihydroxy-4,4'-dimethoxy-5-sulfobenzophenone, 2-hydroxy4-methoxy-benzophenone-5-sulphonic acid as well as the trihydrate thereof.

P-N,N-dimethylaminobenzenediazonium zinc chloride
P-N,N-diethylaminobenzenediazonium zinc chloride
4-(p-tolyl-mercapto)2,5-dimethoxybenzene diazonium zinc chloride
4-(p-tolyl-mercapto)-2,5-diethoxybenzene diazonium zinc chloride
4-morpholino-2,5-dibutoxybenzenediazonium zinc chloride
4-morpholino-2,5-dibotoxybenzenediazonium fluoborate
P-N-ethyl-N-benzylaminobenzene diazonium zinc chloride
4-diazo-diphenylamine sulfate
1-diazo-4-N,N-dimethylamino-benzene zinc chloride
1-diazo-4-N,N-diethylamino-benzene zinc chloride
1-diazo-4-N-ethyl-N-hydroxyethylamino-benzene ½ zinc chloride
1-diazo-4-N-Methyl-N-hydroxyethylamino-benzene ½ zinc chloride
1-diazo-2,5-diethoxy-4-benzoylamino-benzene,½ zinc chloride
1-diazo-4-N-benzylamino-benzene,½ zinc chloride
1-diazo-4-N,N-dimethylamino-benzene borofluoride
1-diazo-4-morpholino-benzene, ½ zinc chloride
1-diazo-4-morpholino-benzene-borofluoride
1-diazo-2,5-dimethoxy-4-p-tolymercaptobenzene, ½ zinc chloride
1-diazo-2-ethoxy-4-N,N-dimethylaminobenzene, ½ zinc chloride
p-diazo-dimethyl aniline, ½ zinc chloride
1-diazo-4-N,N-diethylamino-benzene, ½ zinc chloride
1-diazo-2,5-dibutoxy-4-morpholino-benzene sulfate
1-diazo-2,5-diethoxy-4-morpholino-benzene, ½ zinc chloride
1-diazo-2,5-dimethoxy-4-morpholino-benzene, zinc chloride
1-diazo-2,5-diethoxy-4-morpholino-benzene, ½ zinc chloride
1-diazo-2,5-diethoxy-4-morpholino-benzene-borofluoride
2-diazo-1-naphthol-5-sulfonic acid, sodium salt
1-diazo-4-N,N-diethylamino-benzene, borofluoride
1-diazo-2,5-diethoxy-4-p-tolylmercapto-benzene, ½ zinc chloride
1-diazo-3-ethoxy-4-N-methyl-N-benzylamino-benzene, ½ zinc chloride
1-diazo-3-chloro-4-N,N-diethylamino-benzene, ½ zinc chloride
1-diazo-3-methyl-4-pyrrolidino-benzene chloride, zinc chloride
1-diazo-3-methyl-4-pyrrolidino-benzene-borofluoride
1-diazo-2-chloro-4-N,N-dimethylamino-5-methoxybenzene, borofluoride
1-diazo-3-methoxy-4-pyrrolidino benzene, zinc chloride
condensation product of 4-diazo-diphenylamine sulfate and formaldehyde zinc chloride
p-azide cinnamic acid
2,6-di(4'-azidebenzal)-4-methylcyclohexanone
3-azide phthalic anhydride
4,4'-diazide-3,3'-dimethyl-biphenyl
4,4'-diazide-3,3'-dichloro-biphenyl
4,4'-diazidebenzol acetylacetone
4,4'-diazide-3,3'-dimethoxyl-biphenyl
4,4'-diazide diphenylmethane
4,4'-diazide diphenyl sulfone
2,6-di-(4'-azidebenzal)-cyclohexanone
4,4'-diazidebenzalacetone-2,2'-disulfic acid sodium salt
4,4'-diazide stylbene-2,2'-disulfic acid sodium salt The precipitant dye material may be incorporated into the desired photosensitive composition in any manner deemed suitable by the skilled worker to assure a substantially uniform distribution thereof through the composition to yield a composition possessing the desired uniform color characteristics. This may be accomplished by adequate and thorough admixing of the components, for example, by thorough stirring.

The thus obtained substantially uniformly color dyed photosensitive composition may then be applied to at least one surface of the substrate in connection with which the skilled workers wishes to employ this invention in the reprographic arts. Thus, these compositions may be employed with a transparent film support for eventual employment, after light exposure and development, in color proofing processes, for example as is shown in U.S. Pat. No. 3,486,450. In addition, various other substrates, for example, metal sheets suitable for producing lithographic printing plates, cloth webs, or paper sheets, may also be employed for like purposes. The choice of the substrate which may be employed herein is limited only by the requirements and desires of the skilled worker and the end use to which the thus coated substrate is to be put.

A preferred method of manufacturing the colored photosensitive material of the instant invention comprises,
- (a) reacting an aqueous solution of a water soluble basic dye with a water soluble organic acid or the ammonium or alkali metal salt thereof to precipitate a water insoluble, substantially organic soluble product which is non-reactive with diazo photosensitizers
- (b) separating the precipitate from its aqueous environment.
- (c) uniformly dissolving said precipitate and an organic solvent soluble, light sensitive, negative acting diazo composition in an organic solvent system in which both said dye and said diazo are substantially soluble and thereafter evaporating said solvent system.

It has been found that most satisfactory results are obtained when the solid components of (c) above comprise from about 20% to 60% dyestuff and from about 40% to 80% diazo.

A commercially acceptable photographic element such as a printing plate or color proofing guide may be prepared by applying the solution of (c) above to a suitable substrate such as an aluminum or transparent plastic sheet and then evaporating the solvent system thus leaving a uniform, colored, photosensitive film on a surface of said sheet. Said coated sheet may then be imagewise exposed to an ultraviolet light source through a photographic mask thus insolubilizing the exposed areas and the unexposed areas may be developed with suitable solvents by a method which is well known in the art. Suitable developers include those enumerated in U.S. Pat. Nos. 3,669,660; 3,891,438 and 3,871,439.

It is within the contemplation of the instant invention that other compatible ingredients may also be included in the colored photosensitive composition of the instant invention such as binding resins.

These may include one or more of the following compositions:
(a) polymers, copolymers, terpolymers, etc., graft copolymers, block copolymers, etc., prepared from one of more of the following monomers:

Ethylene
Propylene
1-Butene
Isobutylene
1-Pentene
1-Hexene
1-Heptane
1-Octene
1-Decene
1-Dodecene
αOlefins ($C_{11}$–$C_{18}$)
Butadiene
Isoprene
1,3-pentadiene
Chloroprene
2,3 Dichloro-1,3 Butadiene
Dipentene
Styrene
αMethyl Styrene
t-Butyl Styrene
4 Methyl pentyl styrene
Divinyl benzene
Cyclopentene
Cyclohexene
Cycloheptene
Cyclooctene
CycloNonene
4-Methyl Cyclopentene
4-Ethyl Cyclopentene
4-Pentyl Cyclopentene
4-Hexyl Cyclodecene
Cyclopentadiene
1,3 Cyclohexadiene
1,3,5, Cyclooctatriene
1,3,5 Cyclododecatriene
3-allyl indene
α-piene
$\Delta^\beta$-Carene
Methyl acrylate
Ethyl acrylate
n-Butyl acrylate
Isobutyl acrylate
5-Butyl acrylate
2-Methyl butyl acrylate
Methyl pentyl acrylate
Methyl pentyl acrylate
n-Hexyl Acrylate
n-Heptyl Acrylate
2-Ethylhexyl acrylate
n-Octyl acrylate
n-Nonyl acrylate
n-Decyl acrylate
n-Undecyl acrylate
Lauryl acrylate
6-Methoxy acrylate
Hydroxyethyl acrylate
Hydroxypropyl acrylate
Methoxy butyl acrylate
Butanediol monoacrylate
Ethylene glycol monoacrylate
Diethylene glycol triacrylate
Trimethylolpropane triacrylate
Tetraethylene glycol diacrylate
Tetraethylene glycol di(chloroacrylate)
3-Chloro-2-hydroxypropyl acrylate
2-Cyanoethyl acrylate
Glycidyl acrylate
Methyl methacrylate
n-Butyl methacrylate
t-Butyl methacrylate
n-Hexyl methacrylate
2-Ethylhexyl methacrylate
n-Nonyl methacrylate
n-Decyl methacrylate
n-Dodecyl methacrylate
1-Chlorodecyl methacrylate
Hydroxypropyl methacrylate
Diethylene glycol dimethacrylate
Triethylene glycol dimethacrylate
Tetraethylene glycol dimethacrylate
Trimethylol propane trimethacrylate
Dipropylene glycol dimethacrylate
Di(pentamethylene glycol) dimethacrylate
Ethylene glycol dimethylmethacrylate
2-Cyanoethyl methacrylate
Dimethylamino ethyl methacrylate
Glycidyl methacrylate
Trimethoxysilylpropyl methacrylate
Acrylic acid Methacrylic acid
Crotonic acid
Fumaric acid
Succinic Anhydride
Itaconic acid
Maleic Anhydride
Methylene Glutaric acid
n-t-$C_{12}$ Maleamic acid
Vinyl acetate
Vinyl chloride
Vinylidene chloride
Vinyl benzyl alcohol
Sodium vinyl sulfonate
Methyl vinyl ether
Ethyl vinyl ether
Isobutyl vinyl ether
Acrylonitrile
Methacrylonitrile
Methylene glutaro nitrile
α-Propiolactone
N-vinyl pyrrolidone
N-vinyl caprolactam
N-vinyl imidazole
Acrylamide
Methacrylamide
N-t-Butyl acrylamide
N-Octyl acrylamide
Diacetone acrylamide
N-Methylol acrylamide
N-n-Butoxymethyl methacrylamide
N-Methylol methacrylamide
Trimethylamine methacrylimide
Triethylamine methacrylimide
Tributylamine methacrylimide
3-(2-acryloxyethyl dimethylammonium) propionate betaine
3-(2-Methacryloxyethyl dimethylammonium) propionate betaine
3-(2-Acryloxyethyl dimethylammonium) sulfonate betaine
1,1-Dimethyl-1(2-dryroxypropylamine)4-isopropenyl benzimide
Trimethylamine 4-isopropenyl benzimide
Trimethylamine 4-isopropenyl benzimide
Trimethyl amine 4-vinyl benzimide
N-(2-Aminoethyl) aziridine
N-(2-Cyanoethyl) aziridine
N-(2-Hydroxyethyl) aziridine
Acrolein
Diketene
Dibutyl fumarate
Ethyl acid maleate
Dioctyl maleate
Methyl hydrogen fumarate
Acrylic acid 2-isocyanate ester
Acrylol malonic acid diethyl ester
Phenyl allyl alcohol
α-Propane sulfone
Allyl glycidyl ether
3-Methacryloxypropyl tromethoxysilane (b) Natural and synthetic polymers and elastomers such as:
Natural rubber
Gelatin
Cellulose acetate butyrate
Polyamides
Polyterpene resins
Extract acid polyepoxide resins
Silicone resins
Chlorinated rubber
Ethyl cellulose
Polyvinyl alcohol
Phenol-formaldeyde resins
Polyurethane resins
Isocyanate cross linked polyester resins
Hydroxy terminated polysiloxanes (c) Polymers and elastomers listed above which have been subjected to various chemical modifications such as hydroxylation, carboxylation, thiolation, sulfonation and the like.

The invention may be illustrated by the following examples:

EXAMPLE 1

Preparation of Precipitant Dye Material

Two grams of a basic dye are dissolved in 100 ml. of water in a 250 ml. beaker. In a separate beaker, two grams of an organic acid are dissolved in water. The contents of both beakers are charged into a 500 ml. beaker and subjected to constant agitation until a complete reaction is obtained. The precipitate which is formed is filtered off and air dried to yield the precipitant dye material. The results obtained with various reactants is set forth below in Table A:

TABLE A

| Basic Dye | Organic Acid* |
| --- | --- |
| Calrozine violet PCN | MS-40 |
| Methylene blue | " |
| Chrysoidin | " |
| Rhodamin B | " |
| Astrazon green | " |
| Marachite green | " |
| Astra blue | " |
| Victoria blue | " |
| Astrazon yellow | " |
| Maxillon yellow | " |
| Rhodamin 6G | C |
| Victoria Blue | A |
| Chrysoidin Y | F |
| Victoria Blue | CB |
| Chrysoidin Y | TSA |
| Safraine T | 1506 |
| Rhodamin 6G | BPA |
| Rhodamin 6G | SPS |
| Calcosine auramine | TS |
| Rhodamin 6G | TS |

*MS-40 = 2-hydroxy-4-methoxy benzophenone sulfonic acid
C = Sodium Lauryl sulfonate
A = Cyanamer A 370 (polyacrylamide)
F = Fluoroaescien disodium salt
CB = Calcocid Blue AX
TSA = p-Toluenesulfonic Acid, sodium salt
1506 = 2,4-Dinitro-1-naphthol-7-sulfonic acid
BPA = Benzene Phosphonic acid
SPS = Sodium polystyrene sulfonate
TS = p-Toluene sulfonic acid It has been found that unsuccessful results are obtained if either, the two reactants are incorporated sequentially to a photosensitive composition, or if only basic dye itself is incorporated in the photosensitive composition in an attempt to impart acceptable color or storage stability thereto. This can be seen from the following Examples:

EXAMPLE 2 a. A sensitizer solution consisting of one part of the reaction product of the paradiazo diphenylamine-paraformaldehyde condensate with 2-hydroxy-4-methoxy benzophenone sulfonic acid in 50 parts of methyl cellosolve, 20 parts of methyl alcohol and 30 parts of ethylene dichloride was made. To 100 ml of this solution, 0.4 g of Rhodamine 6G was added, and the solution showed immediate precipitation and show grainy appearance when coated on a sheet of polyester film.

b. To another 100 ml of the above sensitizer solution, 0.4 g of the Rhodamin 6G and MS-40 reaction product was added. The solution thus formed show brilliant red color with intense fluorescence. When coated on 1.5 mil thick polyethylene terephthalate film, it gave a photosensitive red coating of excellent appearance.

EXAMPLE 3 a. To 100 ml of the photosensitizer solution prepared in Example 2, 0.4 g of Victoria blue was added. The solution did not show precipitation when the solution was made. When coated on pilot scale continuous web coating machine, on 1.5 mil thick polyester film it gave grainy coating. A grainy precipitation was also observed inside the coating tray. The sample thus obtained gave a light sensitive image forming property only within one day of accelerated aging test in a 60 degree C. dry oven which corresponds to approximately 3-4 months natural aging which is too short to be commercially acceptable.

b. To 100 ml of the sensitizer solution a reaction product between Victoria blue and an acid MS-40 from Example 1, above was added, the resulting solution showed no sign of precipitation and the coating obtained from the solution had a smooth blue-green appearance. The coating retained its photosensitive image forming property even after 3 days in the dry 60 degree C. oven corresponding to approximately over one year natural aging which is sufficiently long for a commercial product. Similar results were obtained using reaction products of Victoria blue with Polyacrylamid A370, from Example 1, above.

EXAMPLE 4 a. To 100 ml of the sensitizer solution, 0.4 g of Astrazon yellow was added. The solution showed immediate precipitation.

b. A solution was made using the reaction product between Astrazon yellow and MS-40. The solution showed no sign of precipitation even on prolonged storage and the coating made using this solution gave clear photosensitive image forming layer on polyester film.

EXAMPLE 5

The procedure set forth in Example 3 was followed except that up to 1 part 1,1,2,2-tetra(2,3-epoxy-propoxyphenyl) ethane resin was added to the solutions made in Example 3. The resultant solution from Example 3, part (b) with the basic dye-organic acid reaction product retained its clarity both in solution and on coating.

EXAMPLE 6

Safarnin T was reacted with MS-40 using the procedures described in Example 1. Two coating solutions were prepared both containing one part of sensitizer and one part of 1,1,2,2-tetra(2,3-epoxy-propoxyphenyl) ethane resin. Approximately 0.1 part of Safranin T alone, was added to one solution and approximately the same amount of the reaction product thus produced was added to the other. Both were coated on previously grained and anodized aluminum support with a sodium silicate interlayer. Both plates thus made showed acceptable photosensitive image forming characteristics. On accelerated aging tests in elevated temperature, the one with the Safranin T alone, was seen to show early failure as compared to the one with the Safranin T-MS-40 reaction product judged by the increased reluctance of the coating to be removed by processing chemicals.

EXAMPLE 7

It is important to recognize that the purpose for reacting the water soluble basic dye with the water soluble organic acid is not merely to produce a reaction product which is water insoluble and organic solvent soluble. The reaction product has the additional critical property of being non-reacting with the diazo photosensitizer. To demonstrate this point 2 grams each of the following water insoluble, organic solvent soluble dyes were separately dissolved in 50 ml of methyl cellosolve:

| Irasol Black | available commercially from Allied Chem. |
|---|---|
| Nigrosine SSJJ | available commercially from Amer. Cyanamid |
| Calco Spirit Blue THN | available commercially from Amer. Cyanamid |
| Irgacet Yellow GL | available commercially from Ciba-Geigy |

Four samples containing 2 grams of the photosensitizer of Example 2 were dissolved in another 50 ml of methyl cellosolve and blended with each such dyestuff. A precipitated reaction product was formed in each case indicating that the mere property of being water insoluble and organic solvent soluble is insufficient to form a solution with a light sensitive diazo composition.

The invention may be variously otherwise embodied within the scope of the appended claims.

What is claimed is:

1. A method of providing a substantially uniform colored photosensitive composition useful in the reprographic art, which comprises:
    a. Reacting a water soluble basic dye with a water soluble organic acid or the ammonium or alkali metal salt thereof, in an aqueous medium to precipitate a dye substance which is substantially insoluble in water, substantially soluble in organic solvents and substantially non-reactive with diazo photosensitizers;
    b. Separating said precipitated dye substance from its aqueous environment; and
    c. Substantially uniformally dissolving said separated dye substance and a diazo photosensitive composition useful in the reprographic arts in a suitable organic solvent composition said diazo photosensitive composition being a reaction product of a paradiazo diphenylamine-paraformaldehyde condensate with a coupling agent selected from the group consisting of naphthol sulfonic acids and salts thereof, sulfoanthranilic acid, N-lower alkyl-5- sulfoanthranilic acids, sodium 2,2'-dihydroxy-4,4'-dimethoxy-5-sulfobenzophenone, and 2-hydroxy-4-methoxy-benzophenone-5-sulfonic acid and a trihydrate thereof; and
    d. Removing said solvent composition.

2. The method of claim 1 wherein the precipitated dye substance comprises from about 20% to about 60% of the colored photosensitive composition.

3. The method of claim 1 wherein the diazo composition is the reaction product of the paradiazo diphenylamine condensate with formaldehyde with 2-hydroxy-4-methoxy benzophenone sulfonic acid.

4. The method of claim 1 which further comprises the step of blending a compatible binding resin in the solution of step (c) prior to removing the solvent composition.

5. The method of claim 1 wherein the water soluble basic dye is selected from the group of Basic Dyes consisting of Basic Yellow, Basic Red, Basic Violet, Basic Blue and Basic Black.

6. The method of claim 1 wherein the water soluble organic acid is selected from the group consisting of organic acid dyes, carboxylic acids, sulfonic acids, sulfinic acids, phosphoric acids and phosphinic acids, and the ammonium or alkali metal salt thereof.

7. The method of claim 1 wherein the organic solvent composition contains one or more solvents selected from the group consisting of alcohols, esters, ketones and ethers.

8. The colored photosensitive composition produced by the method of claim 1.

9. An article useful in the reprographic arts which comprises a sheet substrate having uniformly applied on at least one surface thereof the colored photosensitive compositions produced by the method of claim 1.

* * * * *